United States Patent
Oku et al.

[11] Patent Number: 6,111,792
[45] Date of Patent: Aug. 29, 2000

[54] NON-VOLATILE SEMICONDUCTOR MEMORY DEVICE FOR SELECTIVE CELL FLASH ERASING/PROGRAMMING

[75] Inventors: Satoru Oku; Hiroyuki Kobatake; Masakazu Amanai; Kazuaki Kato; Masaki Kaneko, all of Tokyo, Japan

[73] Assignee: NEC Corporation, Tokyo, Japan

[21] Appl. No.: 09/267,665

[22] Filed: Mar. 15, 1999

[30] Foreign Application Priority Data

Mar. 16, 1998 [JP] Japan ................................ 10-065176

[51] Int. Cl.$^7$ .................................................. G11C 16/04
[52] U.S. Cl. ................................. 365/185.33; 365/185.12
[58] Field of Search ......................... 365/185.33, 185.12

[56] References Cited

U.S. PATENT DOCUMENTS

| | | | |
|---|---|---|---|
| 5,263,003 | 11/1993 | Cowles et al. | 365/230.03 |
| 5,526,307 | 6/1996 | Yiu et al. | 365/185.01 |
| 5,841,721 | 11/1998 | Kwon et al. | 365/218 |

FOREIGN PATENT DOCUMENTS

| | | |
|---|---|---|
| 5-325576 | 12/1993 | Japan . |
| 6-96592 | 4/1994 | Japan . |

*Primary Examiner*—David Nelms
*Assistant Examiner*—Connie C. Yoha
*Attorney, Agent, or Firm*—Foley & Lardner

[57] ABSTRACT

Disclosed herein is a non-volatile semiconductor memory device comprising a mode signal output means for outputting a mode signal for conducting flash programming or flash erasing, a group selection signal output means for outputting a group selection signal for selecting a row decoding group, a first selection means for selecting the row decoding group controlling the word line in accordance with the group selection signal, and a second selection means selecting the word line corresponding to the memory cell from a plurality of the word lines controlled by the row decoding group selected by the first selection means. In the present inventions the time required for the flash programming and the flash erasing can be reduced without the addition of a further element and the chip areas can be reduced.

8 Claims, 12 Drawing Sheets

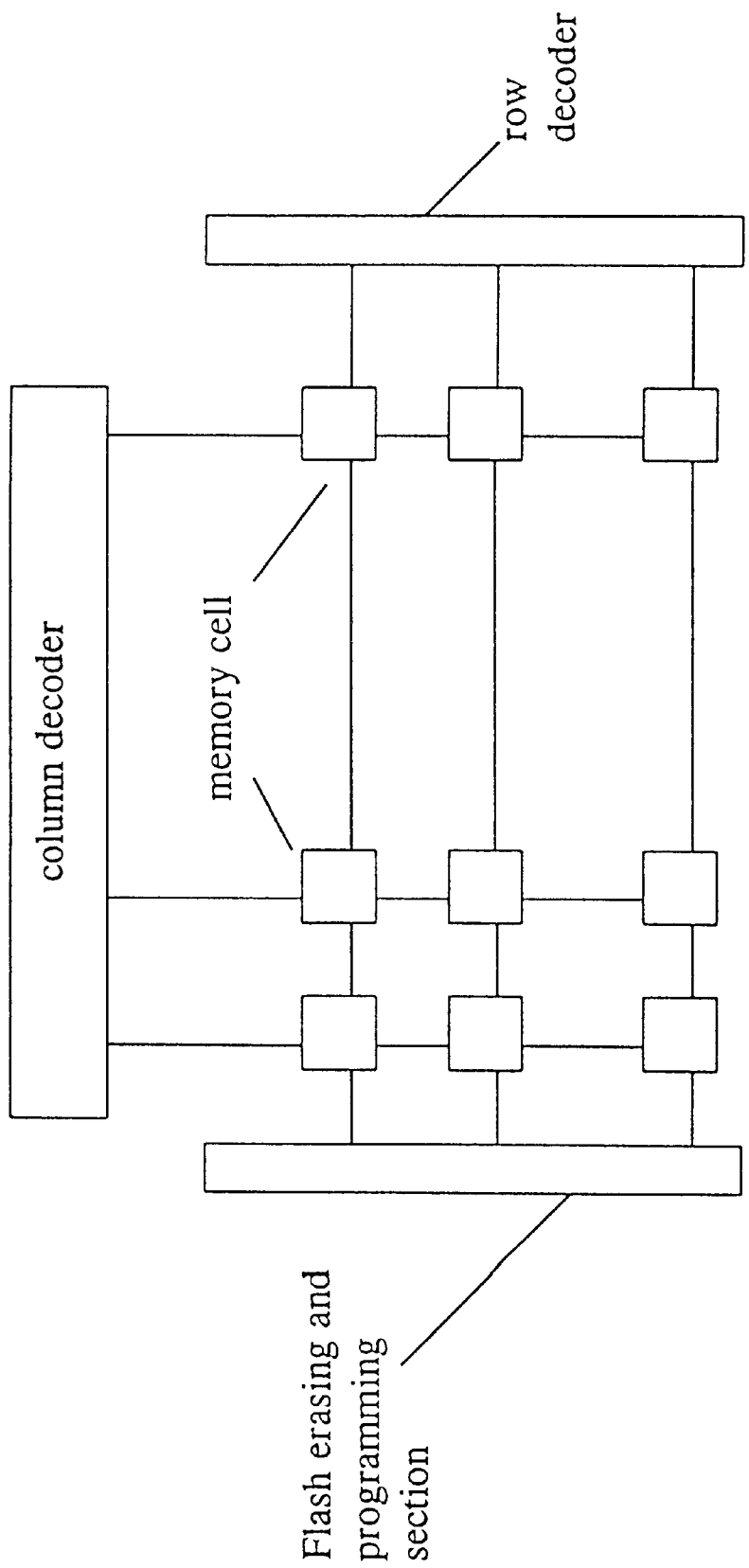

FIG. 6

VOLTAGE FOR RESPECTIVE MODES

| MODE \ TERMINAL | WL | XSPP | XB | $\overline{XB}$ (/XB) | VPW | VNW | XS |
|---|---|---|---|---|---|---|---|
| PROGRAMMING | −9/0 | −9/VDD | VDD/−9 | −9/VDD | VDD | −9 | VDD/0 |
| ERASING | 12/0 | 12 | 12/0 | 0/12 | 12 | 0 | VDD/0 |
| READING | VDD/0 | VDD/0 | VDD/0 | 0/VDD | VDD | 0 | VDD/0 |

FIG. 9

RESPECTIVE STATES FOR BLOCK SELECTION (CP=H)

| TERMINAL | B2 | B4 | B8 | B16 | B32 | A(5) | A(6) | A(7) | A(8) | A(9) | REMARKS |
|---|---|---|---|---|---|---|---|---|---|---|---|
| STATE OF TERMINAL | L | L | L | L | L | A | A | A | A | A | SELECTION OF EVERY BLOCK |
| | H | L | L | L | L | N | A | A | A | A | SELECTION OF EVERY TWO BLOCKS |
| | H | H | L | L | L | N | N | A | A | A | SELECTION OF EVERY FOUR BLOCKS |
| | H | H | H | L | L | N | N | N | A | A | SELECTION OF EVERY EIGHT BLOCKS |
| | H | H | H | H | L | N | N | N | N | A | SELECTION OF EVERY 16 BLOCKS |
| | H | H | H | H | H | N | N | N | N | N | SELECTION OF EVERY 32 BLOCKS |

# NON-VOLATILE SEMICONDUCTOR MEMORY DEVICE FOR SELECTIVE CELL FLASH ERASING/PROGRAMMING

BACKGROUND OF THE INVENTION (a). Field of the Invention

The present invention relates to a non-volatile semiconductor memory device such as flash EEPROM, more in particular to the non-volatile sem-iconductor memory device having a function of selecting a group of word lines.

(b). Description of the Related Art

A conventional flash EEPROM includes a memory cell array having a plurality of non-volatile memory cells located at the respective intersections in a matrix formed by a plurality of word lines and a plurality of bit lines. The EEPROM has a row decoder connected to each of the memory cells through a corresponding word line extending in the row direction and a program circuit connected to each of the memory cells through source lines and bit lines both extending perpendicular to the word lines.

The memory cell array of the EEPROM may have first and second select transistors, a cell transistor constituting the memory cell and the word lines connected to the respective gates of the first and second select transistors. The first select transistor includes a current path having an end connected to the source line and the other end connected to the control gate of the cell transistor. The second select transistor includes a current path having an end connected to the bit line and the other end connected to one end of the current path of the cell transistor The row decoder selects the word line in accordance with a supplied address signal, and the programming circuit selects the source line and the bit line in accordance with a specified signal.

When the programming mode is selected in the above conventional EEPROM, the gate of the select transistor of the selected memory cell is biased to HIGH through the word line to turn ON the select transistor. Since the programming circuit biases one end of the current path of the first select transistor through the source line, for example, to 0V, the control gate of the select transistor is biased to 0V. Since, simultaneously, the programming circuit biases one end of the current path of the second select transistor through the bit line to HIGH, the drain of the cell transistor is biased to somewhat lower HIGH, and the programming is conducted by extracting electric charges from a floating gate.

When an erasing mode is selected, both of the gates of the first and second select transistors in the selected memory cell are biased to HIGH through the word lines to turn ON the transistors. Since, at this time, the programming circuit biases one end of the current path of the first select transistor to HIGH through the source line, the control gate of the cell transistor is biased to somewhat lower HIGH. Since the programming circuit biases one end of the current path of the second select transistor through the bit line, for example, to 0V, one end of the current path of the cell transistor is biased to 0V through the second select transistor. Thereby, electric charges are injected into the floating gate of the first select transistor to perform a flash erasing.

Due to the fact that the programming and the erasing are conducted by the extraction and the injection of the electric charges from and to the floating gate, the time required for the programming and the erasing in the conventional EEPROM is longer than that required for the reading, and is also longer than those of the reading in the case of DRAM (Dynamic RAM) and SRAM (Static RAM) Specifically, the time length required for the programming and the erasing of one word in DRAM and SRAM is several nanoseconds, whereas the time length in EEPROM is several microseconds. Although the flash erasing can be conducted in about one second, the flash programming is hardly conducted without a specific structure.

When EEPROM is forwarded as a manufactured product, the inspection whether or not memory cells correctly operate at all bits (for example, 1M bits). This inspection requires several tens of seconds, and the cost of the product elevates. Therefore, EEPROM is highly desired having a function of enabling the flash programming and the flash erasing and of reducing the time length required for the inspection without a specific structure.

The flash programming and the flash erasing require application of a high voltage. In order to satisfy this requisite, a transistor having a high withstand voltage and a booster circuit having a large current drive ability are necessary, and the sizes of the respective transistors constituting the booster circuit or a control circuit become larger to cause an the increase of chip areas. The attempt of reducing the chip areas by decreasing the current drive ability of the booster circuit makes the time for the programming and the erasing longer. The above problem becomes more remarkable with the recent trend of increasing the storage capacity.

JP-A-06(1994)-96592 discloses a non-volatile semiconductor memory device conducting erasing after a threshold voltage is increased. In the non-volatile semiconductor memory device in this gazette, the disadvantage that an excessively erased state is generated depending on the memory state is averted by conducting flash programming before flash erasing at the time of erasing all memory cells (all bits). In order to realize this operation, the described device has a first flash programming circuit controlling the operation of the flash programming and a second flash programming circuit functioning as a circuit for generating a high voltage and a large current at the time of the flash programming, and the flash programming is conducted block by block.

In the above gazette, a Fouler-Nordheim (F-N) tunneling method is employed for the programming in which a programming current is reduced by establishing the programming voltage to 18V even at a higher voltage side. In this non-volatile semiconductor memory device, a transistor for block selection is required in every word line to increase the chip area. A high voltage obtained by adding a threshold voltage of a block selection transistor to the programming voltage is required for the voltage to be applied to the gate of the block selection transistor. A first flash programming circuit for supplying this high voltage introduces the increase of the chip area because the same number of the circuits as that of the divided blocks are necessary.

JP-A-05(1993)-325576 discloses a non-volatile semiconductor memory device in which the erasing of a memory cell is conducted by every several blocks. In order to reduce the erasing time of the flash erasing of a plurality of the blocks, this non-volatile semiconductor memory device has a latch circuit having a function of holding erased state information. and arranged at an output stage of a row main decoder, and a row sub-decoder functioning as a block erasing section which receives an output from the latch circuit, whereas a flash erasing is performed for the plurality of blocks in accordance with information in the latch circuit. However, in this structure, the reset operations are necessary on all such occasions, and a block address latch operation and an erasing operation must be sequentially established to require a longer time for establishing the memory cell blocks to be erased by flash erasing.

SUMMARY OF THE INVENTION

It is therefore an object of the present invention to provide a non-volatile semiconductor memory device enabling the reduction of time length required for flash programming and flash erasing and the reduction of chip areas without increasing a specific structure.

The present invention provides a non-volatile semiconductor memory device comprising:

a plurality of non-volatile memory cells arranged in a matrix, a plurality of word lines each disposed for a corresponding row of said memory cells, a plurality of bit lines each disposed for a corresponding column of said memory cells, a row decoder including a plurality of row decoding groups each for controlling a specified number of said plurality of word lines;

a column decoder for selecting one of said bit lines, a mode signal output section for outputting a mode signal for performing flash programming or flash erasing, a group selection signal output section for outputting, in timing with the output of said mode signal, a group selection signal for selecting one of said row decoding groups, a first selection section for selecting one of said row decoding groups based on said group selection signal, a second selection section for selecting one of said specified number of said word lines corresponding to said selected one of said decoding groups, and a flash erasing or programming section for effecting flash erasing or flash programming, said memory cells corresponding to said selected one of said specified number of said word lines.

In accordance with the non-volatile semiconductor memory device of the present invention, the time length required for the flash programming and the flash erasing can be reduced without the addition of the specific structure thereby reducing the chip area. The memory cell can be selected in accordance with the current drive ability to the memory cell at the time of the flash programming and the flash erasing. and even a power supply circuit having a low current drive ability can be employed.

The above and other objects, features and advantages of the present invention will be more apparent from the following description referring to the accompanying drawings.

BRIEF DESCRIPTION OF DRAWINGS

FIG. 1A shows a block diagram of a flash memory matrix array.

FIG. 6 is a table showing voltage values in a programming mode, an erasing mode and a reading mode.

FIG. 9 is a table showing the situation of the respective terminals at the time of block selection.

PREFERRED EMBODIMENTS OF THE INVENTION

Now, the present invention is more specifically described with reference to accompanying drawings.

Embodiment 1

Figure 1:
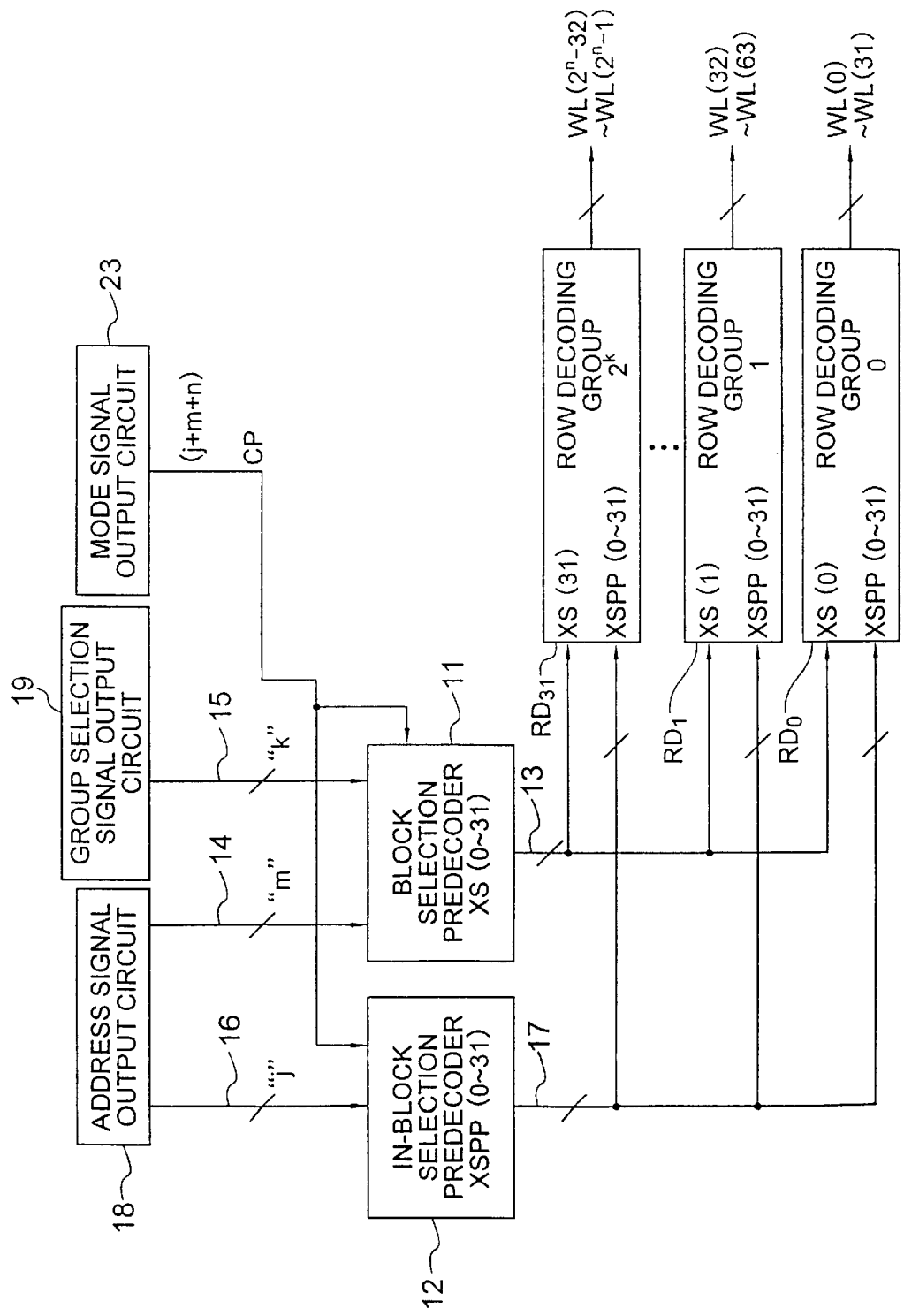
FIG. 1 is a block diagram showing a main section of a row decoder of a non-volatile semiconductor memory device of a first Embodiment.

Referring to FIG. 1, a non-volatile semiconductor memory device in accordance an Embodiment of the present invention has a configuration in which the memory cell is divided into 32 memory cell blocks each of which has 32 word lines. A row decoder has a mode signal output circuit 23, a group selection signal output circuit 19, an address signal output circuit 18, a block selection predecoder 11, an in-block selection predecoder 12, and a plurality of row decoding groups $RD_0$ to $RD_{31}$.

The mode signal output circuit 23 has a function of outputting a whole chip selection signal (mode signal) CP for performing the flash programming and the flash erasing of the memory cells.

The group selection signal output circuit 19 is connected to the block selection predecoder 11 through a number "k" of selection signal lines 15, and outputs a word line group selection signal (group selection signal) to the block selection predecoder 11 in timing with the output of the whole chip selection signal CP. This word line group selection signal is a signal designating the selected number of the row decoding groups corresponding to the word lines WL of the memory cells to be subject to the flash programming or erasing. In this Embodiment, the sum of a number of "m" more significant address signal lines and of a number "j" of less significant address signal lines is a number "n".

The address signal output circuit, 18 is connected to the block selection predecoder (first selection section) 11 through the "m" more significant address signal lines 14 and is connected to the in-block selection predecoder (second selection section) 12 through the "j" less significant address signal lines 16. The address signal output circuit 18 outputs the more significant address signal to the block selection predecoder 11 and outputs the less significant address signal to the in-block selection predecoder 12 in he respective specified timings.

The block selection predecoder 11 selects the row decoding group RD controlling the word lines WL corresponding to the word line group selection signal in accordance with said word line group selection signal, and is connected to the corresponding row decoding groups $RD_0$ to $RD_{32}$ through the 32 more significant address decoding output lines 13. To this block selection predecoder 11 is input the whole chip selection signal CP output from the mode signal output circuit 23. The whole chip selection signal CP selects whether or not a block selection mode is admitted based on the difference between the output bit values. The block selection predecoder 11 activates (selects), when the whole chip selection signal CP equals to a first bit value, not only the row decoding group designated by the more significant address signal but also the following row decoding group and the corresponding more significant address decoder output lines 13. The block selection predecoder 11 further has a function of masking a lower bit of the more significant address decoder outputs (masking section) which are output to the row decoding groups RD in accordance with the word line group selection signal.

The in-block selection predecoder 12 selects a word line WL corresponding to a memory cell in which the flash programming or erasing is performed from a plurality of the word lines WL which are controlled by the row decoding groups RD selected by the block selection predecoder 11. The in-block selection predecoder 12 is connected to the corresponding row decoding groups RD through the less significant address decoder output lines 17, and the whole chip selection signal CP is input thereto from the mode signal output circuit 23. In other words., the in-block selection predecoder 12 collectively activates the specified number of the less significant address decoder output lines 17 corresponding to the row decoding groups RD selected by the block selection predecoder 11 when the whole chip selection signal (mode signal) CP equals to a second bit value. The in-block selection predecoder 12 further has a function of masking a less significant address decoder output (masking section) which is output to the row decoding group RD designated by the less significant address signal in accordance with the whole chip selection signal CP. This masking function changes from a first state masking all the less significant address decoder outputs to a second state masking a specified output, and vice versa.

The more significant address decoding output XS(0) and the less significant address decoding outputs XSPP(0) to XSPP(31) are input to the row decoding group $RD_0$ from the block selection predecoder 11 and the in-block selection predecoder 12, respectively, and the row decoding group $RD_0$ outputs activated signals to the corresponding word lines WL(0) to WL(31). The more significant address decoding output XS(1) and the less significant address decoding outputs XSPP(0) to XSPP(31) are input to the row decoding group $RD_1$, and the row decoding group $RD_1$ outputs activated signals to the corresponding word lines WL(32) to WL(63). The more significant address decoding output XS(31) and the less significant address decoding outputs XSPP(0) to XSPP(31) are input to the row decoding group $RD_{31}$, and the row decoding group $RD_{31}$ outputs activated signals to the corresponding word lines WL($2^n$-32) to WL($2^n$-1).

Figure 2:
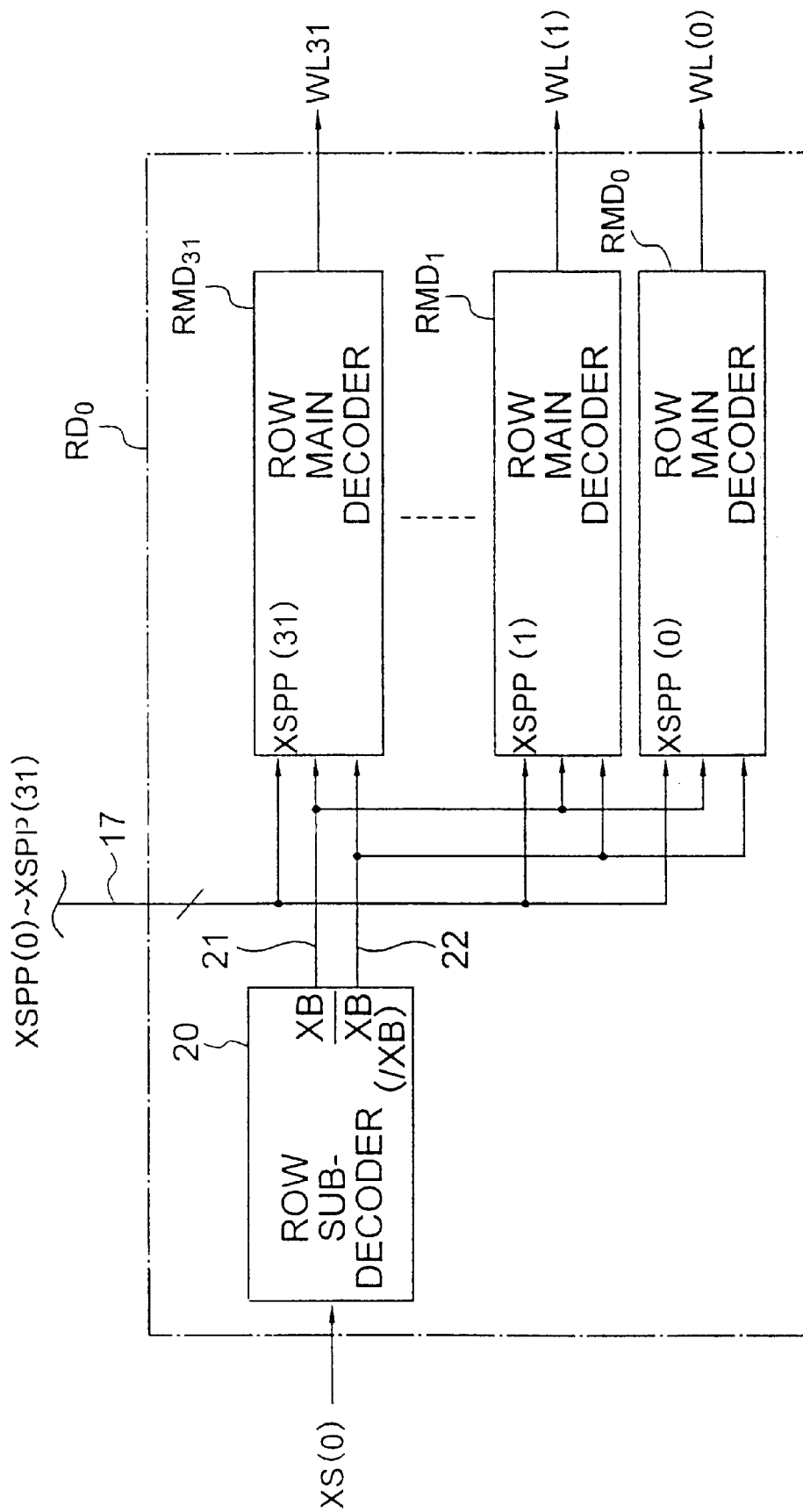
FIG. 2 is a block diagram showing row decoding groups in FIG. 1 in detail.

FIG. 2 is a block diagram showing the row decoding group in FIG. 1 in detail. Since the row decoding groups $RD_0$ to $RD_{31}$ have the same constitution, only the row decoding groups $RD_0$ will be described. The row decoding group $RD_0$ has row main decoders $RMD_0$ to $RMD_{31}$ and a row sub-decoder 20 connected to the respective row main decoders RMD0 to RMD31 through signal lines 21,22.

The row sub-decoder 20 outputs a non-inverted value XB of a sub-decoder signal through the signal line 21 and an inverted value of the sub-decoder signal (hereinafter referred to as "/XB") through the signal line 22 to the corresponding row main decoders $RMD_0$ to $RMD_{31}$ when the more significant address decoding output XS(0) is input from the block selection predecoder 11. The corresponding outputs among the less significant address decoding outputs XPPS(0 to 31) are input to the respective row main decoder $RMD_0$ to $RMD_{31}$. Thereby, the respective row main decoders $RMD_0$ to $RMD_{31}$ input activated signals to the corresponding word lines WL(0) to WL(31).

Figure 3:
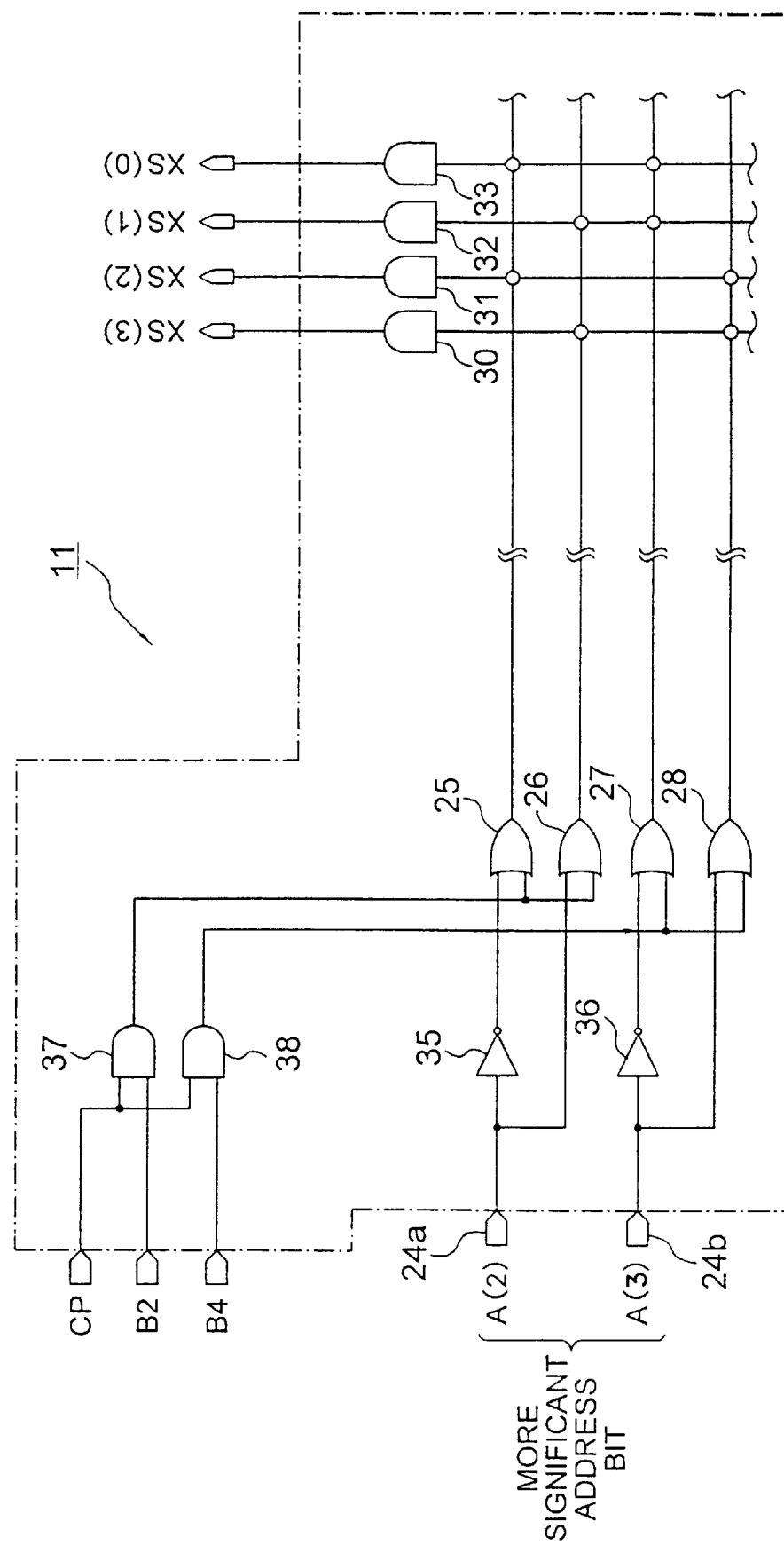
FIG. 3 is an equivalent circuit diagram showing an example of a block selection predecoder in detail.

FIG. 3 is an equivalent circuit diagram showing one Example of the block selection predecoder 11. The non-volatile semiconductor memory device will be described to be divided into four memory blocks each of which has four word lines. In FIG. 3, the number "m" of more significant address signal lines is two, and A(3) and A(2) are input as address signals. The block selection predecoder 11 has inverters 35,36, AND gates 37,38, OR gates 25 to 28 and AND gates 30 to 33. The AND gates 30 to 33 are AND circuits having two inputs, and signals present on white circles at intersections on input signal lines are input thereto.

The inverter 35 supplies the more significant address signal A(2) input to an address signal input terminal 24a from the address signal output circuit 18 after its inversion to one terminal of the OR gate 25. The inverter 36 supplies the more significant, address signal A(3) input to an address signal input terminal 24b from the address signal output circuit 18 after its inversion to one terminal of the OR gate 27. The non-inverted values of the more significant address signals A(2) and A(3) are supplied to both of one terminals of the OR gates 26,28.

The whole chip selection signal CP from the mode signal output circuit 23 and the word line group selection signal B2 from the group selection signal output circuit 19 are input to the AND gate 37, and it supplies its logic product to both of the other terminals of the OR gates 25,26. The whole chip selection signal CP and a word line group selection signal B4 are input to the AND gate 38, and it supplies its logic product to both of the other terminals of the OR gates 27,28. The. word line selection signal B2 becomes "H" when two blocks are selected while the word line selection signal B4 becomes "H" when four blocks are selected.

The logic sum output from the OR gates 26,28 is input to the AND gate 30 and it outputs its logic product as a more significant address decoding output XS(3). The logic sum output from the OR gates 25,28 is input to the AND gate 31 and it outputs its logic product as a more significant address decoding output XS(2). The logic sum output from the OR gates 26,27 is input to the AND gate 32 and it outputs its logic product as a more significant address decoding output XS(1). The logic sum output from the OR gates 25,27 is input to the AND gate 33 and it outputs its logic product as a more significant address decoding output XS(0).

The operation of the block selection predecoder 11 when the block selection is not conducted will be described with reference to a truth table of Table 1. This truth table shows the respective outputs when the whole chip selection signal CP is LOW "L". When both of the more significant address signals A(2) and A(3) are LOW, the respective outputs of the OR gates 25 to 28 are HIGH(H), LOW(L), HIGH(H) and LOW(L) in this turn, and the more significant address decoding output XS(0) which is a selected output becomes HIGH and the more significant address decoding outputs XS(1) to XS(3) are LOW. When the more significant address signal A(2) is HIGH and the more significant address signal A(3) is LOW, the respective outputs of the OR gates 25 to 28 are LOW,HIGH, HIGH and LOW in this turn, and the more significant address decoding output XS(1) becomes HIGH and the more significant address decoding outputs XS(0), XS(2) and XS(3) are LOW. When the more significant address signal A(2) is LOW and the more significant address decoding signal A(3) is HIGH, the respective outputs of the OR gates 25 to 28 are HIGH, LOW, LOW and HIGH in this turn, and the more significant address decoding output XS(2) becomes HIGH. When both of the more significant address signals A(2) and A(3) are HIGH, the respective outputs of the OR gates 25 to 28 are LOW, HIGH, LOW and HIGH in this turn, and the more significant address decoding output XS(3) becomes HIGH. In this manner, one decoding output XS(i) is selected corresponding to the more significant address signals A(3) and A(2).

TABLE 1

| MORE SIGNIFICANT ADDRESS SIGNAL | | OUTPUT STATE OF OR | | | | SELECTED |
|---|---|---|---|---|---|---|
| A(3) | A(2) | 28 | 27 | 26 | 25 | OUTPUT |
| L | L | L | H | L | H | XS(0) |
| L | H | L | H | H | L | XS(1) |
| H | L | H | L | L | H | XS(2) |
| H | H | H | L | H | L | XS(3) |

Then, simultaneous selection of two blocks will be described. A truth table of Table 2 shows the respective outputs when the whole chip selection signal CP is HIGH and the word line group selection signal B2 is HIGH. When both of the more significant address signals A(2) and A(3) are LOW, the respective outputs of the OR gates 25 to 28 are HIGH, HIGH, HIGH and LOW, and the more significant address decoding outputs XS(0) and XS(1) which are the selected outputs become HIGH and the more significant address decoding outputs XS(2) and XS(3) are LOW. When the more significant address signal A(2) is HIGH and the more significant address decoding signal A(3) is LOW, the respective outputs of the OR gates 25 to 28 are HIGH, HIGH, HIGH and LOW in this turn, and the more significant address decoding outputs XS(0) and XS(1) become HIGH and the more significant address decoding outputs XS(2) and XS(3) become LOW.

When the more significant address signal A(2) is LOW and the more significant address decoding signal A(3) is HIGH, the respective outputs of the OR gates 25 to 28 are HIGH, HIGH, LOW and HIGH in this turn, and the more significant address decoding outputs XS(2) and XS(3) become HIGH and the more significant address decoding outputs XS(0) and XS(1) become LOW. When both of the more significant address signals A(2) and A(3) are HIGH, the respective outputs of the OR gates 25 to 28 are HIGH, HIGH, LOW and HIGH in this turn, and the more significant address decoding outputs XS(2) and XS(3) become HIGH and the more significant address decoding outputs XS(0) and XS(1) become LOW. In this manner, when the word line group selection signal B2 is made to be HIGH, the two blocks are simultaneously selected.

TABLE 2

| MORE SIGNIFICANT ADDRESS SIGNAL | | OUTPUT STATE OF OR | | | | SELECTED |
|---|---|---|---|---|---|---|
| A(3) | A(2) | 28 | 27 | 26 | 25 | OUTPUT |
| L | L | L | H | H | H | XS(0), XS(1) |
| L | H | L | H | H | H | |
| H | L | H | L | H | H | XS(2), XS(3) |
| H | H | H | L | H | H | |

When the whole chip selection signal CP is HIGH and the word line group selection signal B2 is HIGH, the outputs of the OR gates 25,26 are always HIGH regardless of the value of the more significant address signal A(2). That is, the more significant address signal A(2) is masked by the word line group selection signal B2 and the output of the decoding circuit is determined by the value of the more significant address signal A(3).

Then, the simultaneous selection of all the four blocks will be described. A truth table of Table 3 shows the respective outputs when the whole chip selection signal CP is HIGH, the word line group selection signal B2 is HIGH and the word line group selection signal B4 is HIGH. In Table 3, all the more significant address decoding outputs XS(0) to XS(3) are selected regardless of the states of the more significant address signals A(3) and A(2)

When both of the more significant address signals A(2) and A(3) are LOW, all the respective outputs of the OR gates 25 to 28 are HIGH, and the more significant address decoding outputs XS(0) to XS(3) which are the selected outputs become HIGH When the more significant address signal A(2) is HIGH and the more significant address decoding signal A(3) is LOW, all the respective outputs of the OR gates 25 to 28 are HIGH, and the more significant address decoding outputs XS(0) to XS(3) become HIGH. When the more significant address signal A(2) is LOW and the more significant address decoding signal A(3) is HIGH, all the respective outputs of the OR gates 25 to 28 are HIGH, and the more significant address decoding outputs XS(0) to XS(3) become HIGH. When both of the more significant address signals A(2) and A(3) are HIGH, all the respective outputs of the OR gates 25 to 28 are HIGH, and the more significant address decoding outputs XS(0) to XS(3) become HIGH.

When the whole chip selection signal CP is HIGH and the word line group selection signals B4 and B2 are HIGH, the outputs of the OR gates 25 to 28 are always HIGH regardless of the values of the more significant address signal A(2) and A(3). That is, the more significant address signal A(2) and A(3) are masked by the word line group selection signal B4 and all the outputs of the decoding circuit are HIGH.

TABLE 3

| MORE SIGNIFICANT ADDRESS SIGNAL | | OUTPUT STATE OF OR | | | | SELECTED |
|---|---|---|---|---|---|---|
| A(3) | A(2) | 28 | 27 | 26 | 25 | OUTPUT |
| L | L | H | H | H | H | XS(0), XS(1) |
| L | H | H | H | H | H | XS(2), XS(3) |
| H | L | H | H | H | H | |
| H | H | H | H | H | H | |

Figure 4:
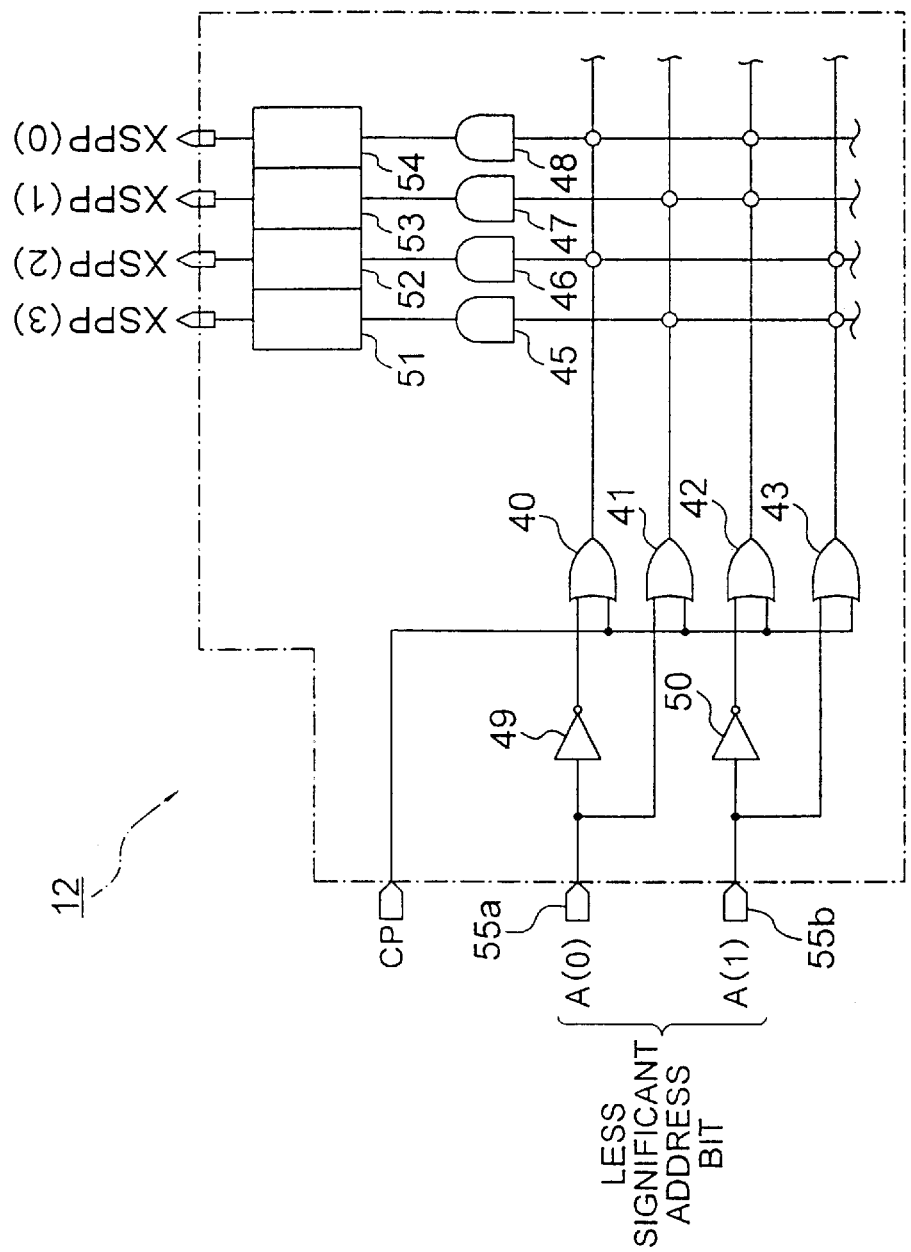
FIG. 4 is all equivalent circuit diagram showing an in-block selection predecoder in detail.

FIG. 4 is an equivalent circuit diagram showing the constitution of the in-block selection predecoder 12 in detail. The respective memory blocks of the non-volatile semiconductor memory device will be described to have four word lines. In FIG. 4, the number "m" of the less significant address signal lines is two, and A(1) and A(0) are input as less significant address signals. The in-block selection predecoder 12 has inverters 49,50, OR gates 40 to 43, AND gates 45 to 48 and decoding voltage-changing circuits 51 to 54.

The inverter 49 receives the less significant address signal A(0) input from the address signal output circuit 18 through an address signal input terminal 55a and supplies to one terminal of the OR gate 40 after its conversion. The inverter 50 receives the less significant address signal A(1) input from the address signal output circuit 18 through an address signal input terminal 55b and supplies to one terminal of the OR gate 42 after its conversion. The non-inverted less significant address signals A(0) and A(1) are supplied to both of one terminals of the OR gates 41,43. To the other terminals of the OR gates 40 to 43 are supplied the whole chip selection signals CP from the mode signal output circuit 23.

The AND gate 45 receives the respective logic sums output from the OR gates 41,43, and outputs its logic product to the decoding voltage changing circuit 51. The AND gate 46 receives the respective logic sums output from the OR gates 40,43, and outputs its logic product to the decoding voltage changing circuit 52. The AND gate 47 receives the respective logic sums output from the OR gates 41,42, and outputs its logic product to the decoding voltage changing circuit 53. The AND gate 48 receives the respective logic sums output from the OR gates 40,42, and outputs its logic product to the decoding voltage changing circuit 54.

When the whole chip selection signal CP is LOW, the in-block selection predecoder 12 implements an ordinary address decoding operation. That is, one less significant address decoding output XSPP(i) specified by the less significant address signals A(0), A(1) becomes HIGH, and the other three signal lines become LOW. When the whole chip selection signal is HIGH, the in-block selection predecoder 12 implements the ordinary address decoding operation. That is, all the less significant address decoding outputs XSPP(0) to XSPP(3) become HIGH regardless of the values of the less significant address signals A(1), A(2). Accordingly, all the word lines in one block can be selected by making the whole chip selection signal HIGH.

Figure 5:
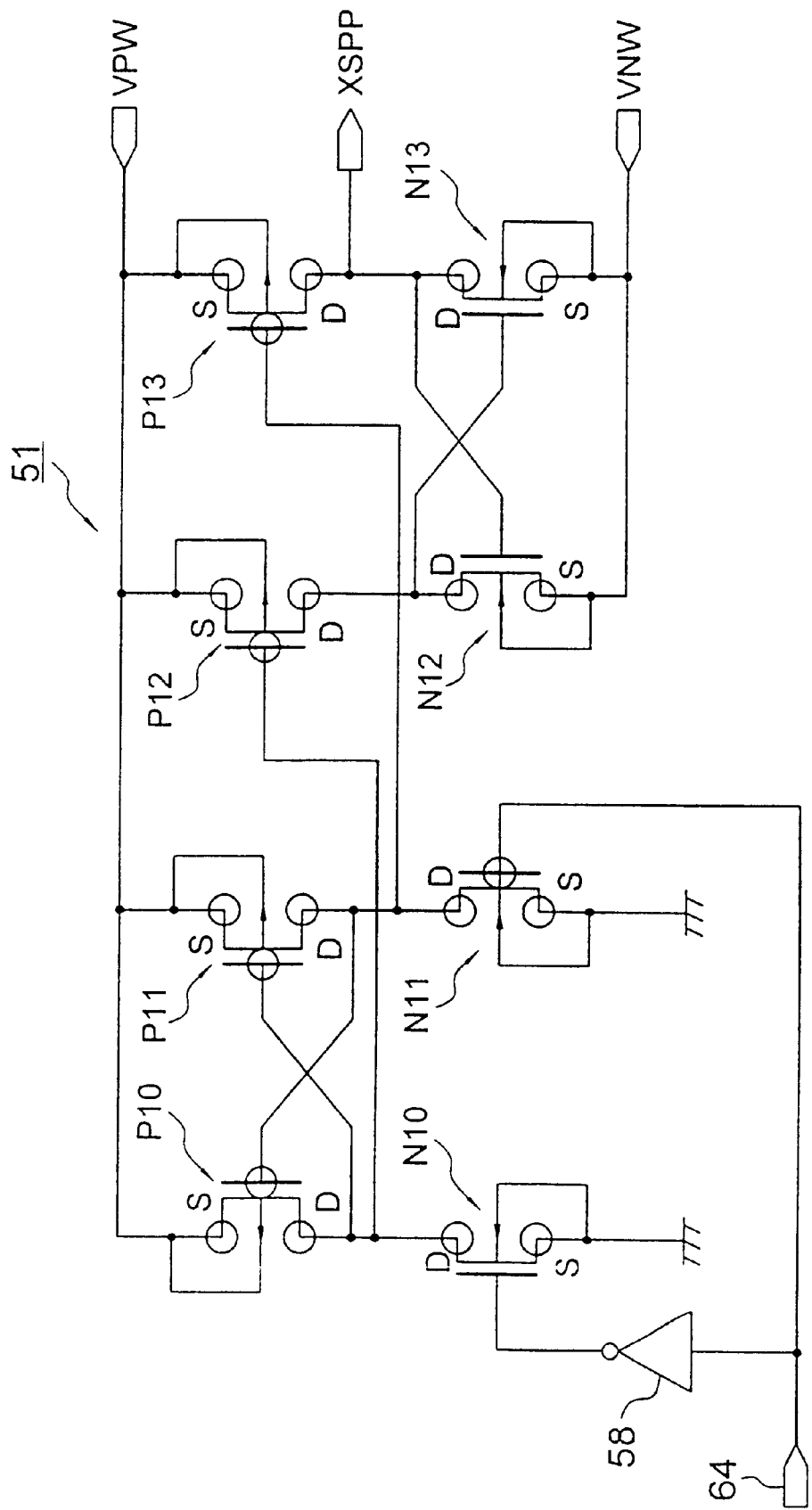
FIG. 5 is an equivalent circuit diagram showing a decoding voltage changing circuit.

FIG. 5 is an equivalent circuit diagram showing the decoding voltage changing circuit. Since the decoding voltage changing circuits 51 to 54 have the same constitution, only the decoding voltage changing circuit 51 will be described.

The decoding voltage changing circuit 51 is a circuit for converting the signals 0V to VDD input to a terminal 64 into voltages −9V to +12V corresponding to the respective operation modes of reading/programming/erasing. The decoding voltage changing circuit 51 includes P-channel MOS transistors (hereinafter referred to as "PMOS transistor") P10 to P13 having a high withstand voltage and N-channel MOS transistors (hereinafter referred to as "NMOS transistor") N10 to N13 having a high withstand voltage. The drains of the PMOS transistor P10 and of the NMOS transistor N10 are connected to each other to form an output to the gate of the PMOS transistor P12 in the later stage. The back gate of the PMOS transistor P10 is connected to its source and the back gate of the NMOS transistor N10 is connected to its source. The drains of the PMOS transistor P11 and of the NMOS transistor N11 are connected to each other to form an output to the gate of the PMOS transistor P13 in the later stage. The back gate of the PMOS transistor P11 is connected to its source and the back gate of the NMOS transistor N11 is connected to its source.

The gate of the PMOS transistor P10 is connected to the common connection point between the PMOS transistor P11 and the NMOS transistor N11, and the gate of the PMOS transistor P11 is connected to the connection point between the PMOS transistor P10 and the NMOS transistor N10. Both of the sources of the PMOS transistors P10 and P11 are connected to a signal line VPW, and both of the sources of the NMOS transistors N10 and N11 are connected to ground. The output of the AND gate 45 (FIG. 4) input from an input terminal 64 is inverted in an inverter 58 and then supplied to the gate of the NMOS transistor N10, and the above output is supplied to the gate of the NMOS transistor N11 without inversion.

The drains of the PMOS transistor P12 and of the NMOS transistor N12 are connected to each other to form an output to the gate of the NMOS transistor N13. The drains of the PMOS transistor P13 and of the NMOS transistor N13 are connected to each other to form an output to the gate of the NMOS transistor N12 and to form an output to the less significant address decoding output XSPP. The source of the PMOS transistor P12 is connected to the high withstand voltage Pch well potential VPW and the back gate thereof is connected to its source. The source of the NMOS transistor N12 is connected to a high withstand voltage Nch well potential VNW and the back gate thereof is connected to its source. The source of the PMOS transistor P13 is connected to the high withstand voltage Pch well potential VPW and the back gate thereof is connected to its source. The source of the NMOS transistor N13 is connected to the high withstand voltage Nch well potential VNW and the back gate thereof is connected to its source.

FIG. 6 is a table showing voltage values in the programming mode, the erasing mode and the reading mode. The operation of the above decoding voltage changing circuit 51 will be described referring to this table.

In the decoding voltage changing circuit 51, VDD (for example, 3V) as the high withstand voltage Pch well potential is supplied to the respective sources of the PMOS transistors P10 to P13 and −9V as the high withstand voltage well potential VNW is supplied to the respective sources of the NMOS transistors N12 and N13 in the programming mode. When, under this condition, LOW is input as a non-selection signal from the AND gate 45, HIGH is applied to the gate of the NMOS transistor N10 and a LOW signal is applied to the gate of the NMOS transistor N11. Since the PMOS transistor P11 becomes ON by the LOW signal applied to its gate and simultaneously the NMOS transistor N10 becomes ON by a HIGH signal applied to its gate, VDD is supplied to a current path which is then applied to the gate of the PMOS transistor P12. At this time, LOW is applied to the gate of the PMOS transistor P13. Therefore, the PMOS transistor P12 is OFF and the PMOS transistor P13 is ON, and −9V which is the high withstand voltage Nch well potential VNW is output as the less significant address decoding output XSPP.

When, on the other hand, HIGH is input as a selection signal from the AND gate 45, a HIGH signal is applied to the gate of the NMOS transistor N11 and a LOW signal is applied to the gate of the NMOS transistor N10. Since the PMOS transistor P10 becomes ON by the LOW signal applied to its gate and simultaneously the NMOS transistor N11 becomes ON by the HIGH signal applied to its gate, VDD is supplied to a current path which is then applied to the gate of the PMOS transistor P12 in the later stage. At this time, LOW is applied to the gate of the PMOS transistor P13. Since, therefore, the PMOS transistor P13 is ON and the PMOS transistor P12 is ON, VDD which is the high withstand voltage Pch well potential VPW is applied to the gate to turn ON the NMOS transistor N12 and VDD which is the high withstand voltage Pch well potential VPW is output as the less significant address decoding output XSPP.

The respective voltages in the table of FIG. 6 are shown to be selected/non-selected. In the erasing mode, the activation signal to the word line WL becomes 12 V when selected, and becomes 0V when non-selected. The less significant address decoding output XSPP becomes 12 V when selected; and the non-inverted value of the address signal becomes 12 V when selected and becomes 0V when non-selected. The inverted value of the address signal becomes 0V when selected and becomes 12V when non-selected, and the high withstand voltage Pch well potential VPW becomes 12V when selected. The high withstand voltage Nch well potential VNW becomes 0V when selected, and the more significant address decoding output XS becomes VDD when selected and becomes 0V when non-selected. On the other hand, in the reading mode, the activation signal to the word line WL becomes VDD when selected, and becomes 0V when non-selected. The less significant address decoding output XSPP becomes VDD when selected and becomes 0V when non-selected, and the non-inverted value of the address signal becomes VDD when selected and becomes 0V when non-selected. The inverted value of the address signal becomes 0V when elected and becomes VDD when non-selected, and the high withstand voltage Pch well potential VPW becomes VDD when selected. The high withstand voltage Nch well potential VNW becomes 0V when selected, and the more significant address decoding output XS becomes VDD when selected and becomes 0V when. non-selected.

Figure 7:
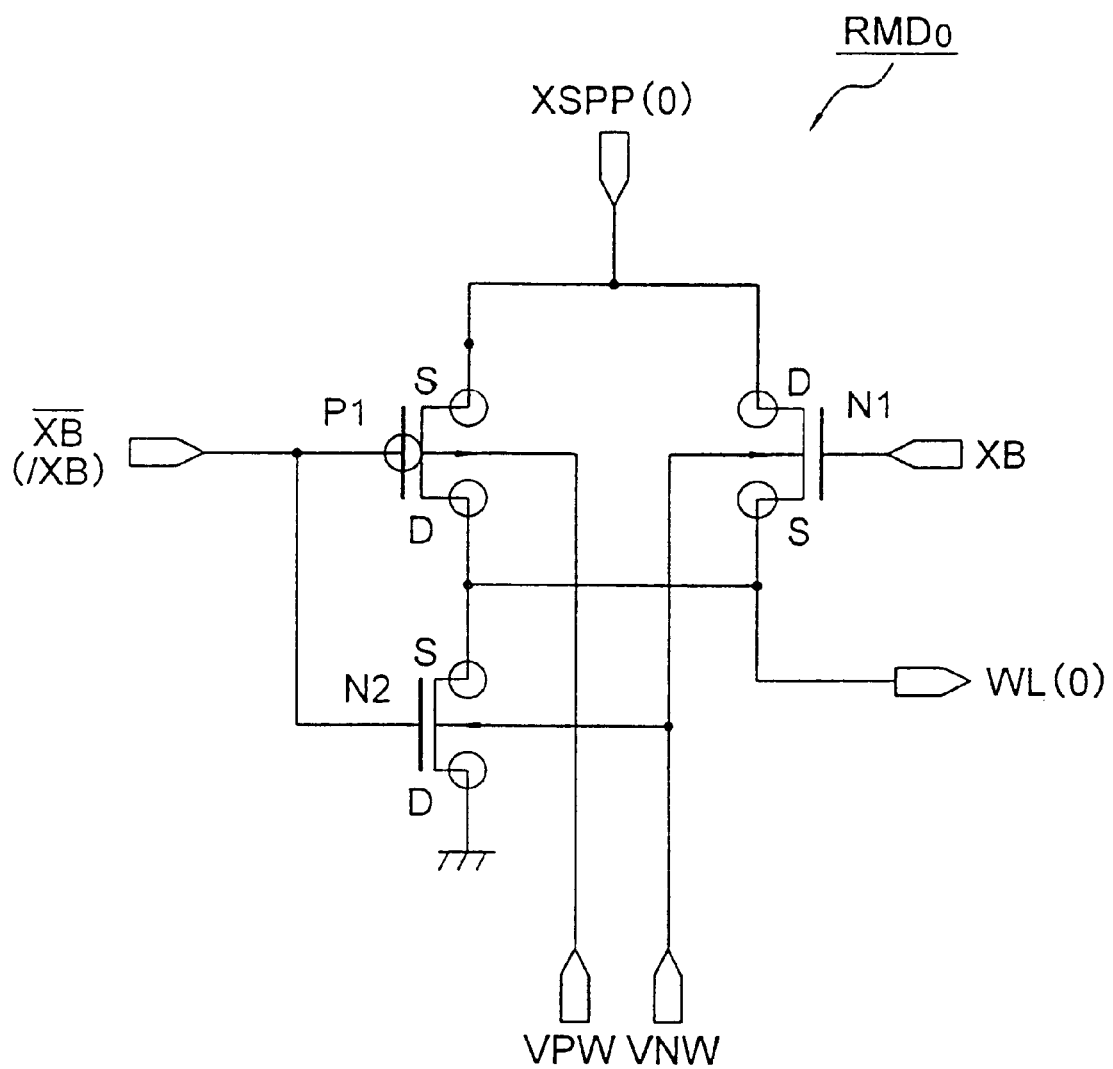
FIG. 7 is an equivalent circuit diagram showing the row main decoder in FIG. 2.

FIG. 7 is an equivalent circuit diagram showing the row main decoder in FIG. 2. Since the row main decoders $RMD_0$ to $RMD_{31}$ have the same structure, only the row main decoder $RMD_0$ will be described.

The row main decoder $RMD_0$ has a high withstand voltage PMOS transistor P1 and high withstand voltage NMOS transistor N1 and N2. Both of the drains of the PMOS transistor P1 and of the NMOS transistor N2 are commonly connected to the source of the NMOS transistor N1 to form an input to a word line WL(0). The source of the PMOS transistor P1 is connected to the less significant address decoding output XSPP(0), and the source of the NMOS transistor N2 is connected to ground. To both of the gates of the transistors P1 and N2 are supplied the inverted values of the sub-decoder output (/XB).

The high withstand voltage Pch well potential VPW and the high withstand voltage Nch well potential VNW are applied to the back gate of the PMOS transistor P1 and to the back gate of the NMOS transistor N2, respectively. The NMOS transistor N1 has a drain connected to the less significant address decoding output XSPP(0), a gate connected to the non-inverted value XB of the sub-decoder output and a back gate connected to the high withstand voltage Nch well potential VNW.

The operation of the row main decoder $RMD_0$ will be described referring to the table of FIG. 6. For example, in the programming mode, the less significant address decoding outputs XPSS(0) are supplied to the source of the PMOS transistor P1 and to the drain of the NMOS transistor N1, and VDD is supplied as the high withstand voltage Pch well potential VPW to the back gate of the PMOS transistor P1. To the back gate of the NMOS transistor N1 is supplied −9V as the high withstand voltage Nch well potential VNW. When, in this situation, the selection signal VDD is applied as the inverted value of the sub-decoder output (/XB) to the gate of the PMOS transistor P1 and the selection signal −9V is applied as the non-inverted value XB to the gate of the NMOS transistor N1, the NMOS transistor N1 turns ON, the PMOS transistor P1 turns ON and the NMOS transistor N2 turns OFF. Thereby, −9V is output as the selection signal to the word line WL.

Figure 8:
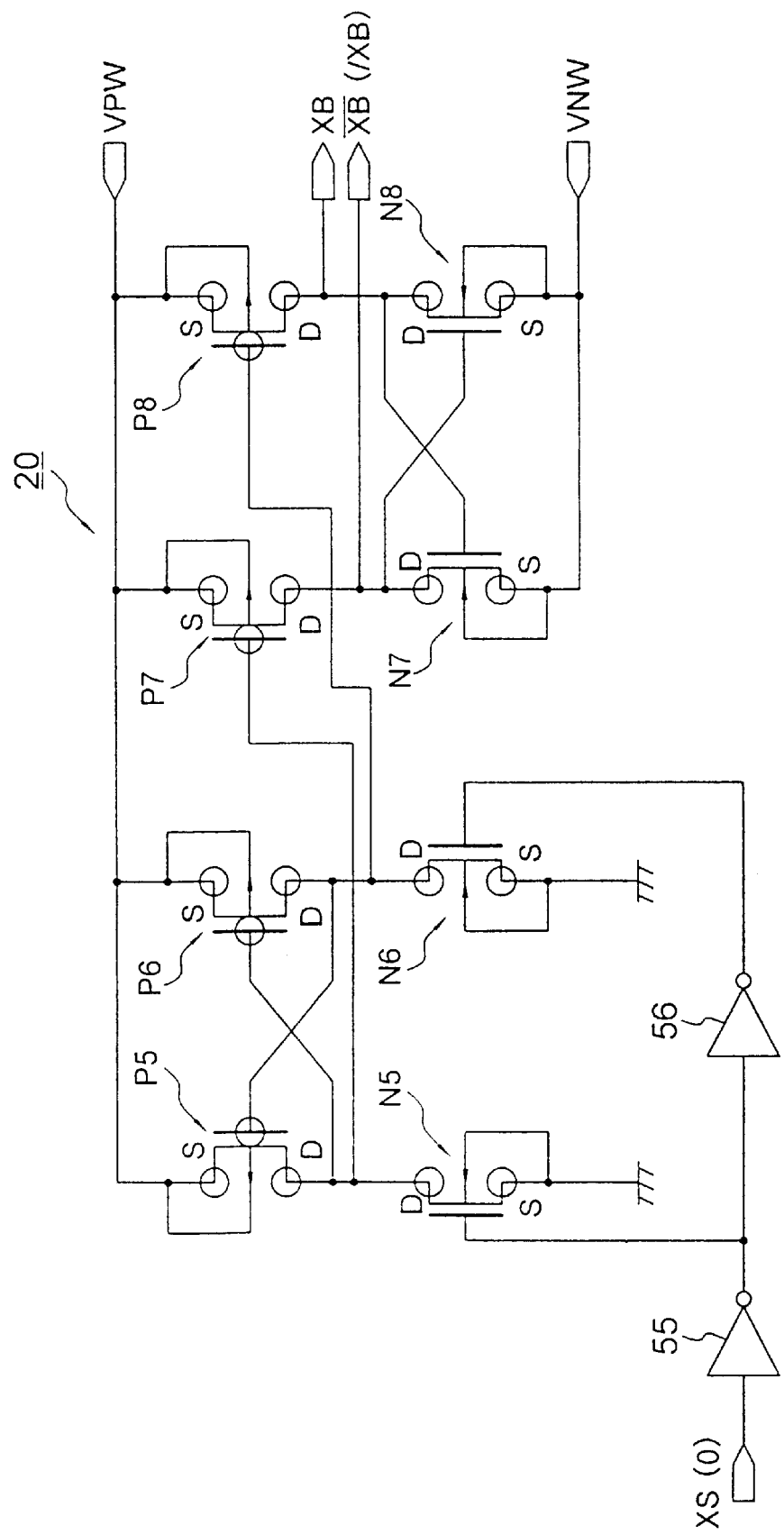
FIG. 8 is an equivalent circuit diagram showing the row sub-decoder in FIG. 2.

FIG. 8 is an equivalent circuit diagram showing the row sub-decoder in FIG. 2. The row sub-decoder 20 has high withstand voltage PMOS transistors P5 to P8 and high withstand voltage NMOS transistors N5 to N8. Both of the drains of the PMOS transistor P5 and of the NMOS transistor N5 are connected to each other to form an output to the gate of the transistor P7 in the later stage. The back gate of the PMOS transistor P5 is connected to its source, and the back gate of the NMOS transistor N5 is connected to its source. Both of the drains of the PMOS transistor P6 and of the NMOS transistor N6 are connected to each other to form an output to the gate of the transistor P8 in the later stage. The back gate of the PMOS transistor P6 is connected to its source, and the back gate of the NMOS transistor N6 is connected to its source.

The gate of the PMOS transistor P5 is connected to the common connection point between the PMOS transistor P6 and the NMOS transistor N6, and the gate of the PMOS transistor P6 is connected to the common connection point between the PMOS transistor P5 and the NMOS transistor N5. Both of the sources of the PMOS transistors P5 and P6 are connected to the signal line VPW, and both of the sources of the NMOS transistors N5 and N6 are connected to ground. The more significant address decoding output XS(0) from the block selection predecoder 11 is inverted in an inverter 55 and then supplied to the gate of the NMOS transistor N5, and the inverted signal by the inverter 55 is input to the gate of the NMOS transistor N6 after re-inversion.

Both of the drains of the PMOS transistor P7 and of the NMOS transistor N7 are connected to each other to form an output of the inverted value (/XB). Both of the drains of the PMOS transistor P8 and of the NMOS transistor N8 are connected to each other to form arT output of the non-inverted value XB. The source of the PMOS transistor P7 is connected to the high withstand voltage Pch well potential VPW, and the, back gate thereof is connected to its source. The source of tile PMOS transistor P8 is connected to the high withstand voltage Pch well potential VPW, and the back gate thereof is connected to its source. The source of the NMOS transistor N8 is connected to the high withstand voltage Nch well potential VNW, and the back gate thereof is connected to its source.

Then, the operation of the row sub-decoder 20 will be described referring to the table of FIG. 6. In the row sub-decoder 20, for example, in the programming mode, VDD is supplied as the high withstand voltage Pch well potential VPW to the respective sources of the PMOS transistors P5 to P8 and −9V is supplied as the high withstand voltage Nch well potential VNW to the respective sources of the NMOS transistors N7 and N8. When, in this situation, the non-selection LOW signal (0V) is input as the more significant address decoding output XS(31), HIGH is applied to the gate of the NMOS transistor N5 and a LOW signal is applied to the gate of the NMOS transistor N6. Thereby, since the PMOS transistor P6 is turned ON by the LOW signal applied to its gate and the NMOS transistor N5 is simultaneously turned ON by the HIGH signal applied to its gate, VDD is supplied to a current path which is then applied to the gate of the PMOS transistor P7 in the later stage. At this time, LOW is applied to the gate of the PMOS transistor P7. Therefore, the PMOS transistor P8 is OFF and the PMOS transistor P7 is ON, and VDD which is the high withstand voltage Pch well potential VPW is output as a signal (/XB). At this time, −9V is output as XB which is an inverted value of the sub-decoder output.

When, on the other hand, a HIGH selection signal (VDD) is input as the more significant address decoding output XS(0), a HIGH signal is applied to the gate of the NMOS transistor N6 and a LOW signal is applied to the gate of the NMOS transistor N5. Since the PMOS transistor P5 turns ON by the LOW signal applied to its gate and simultaneously the NMOS transistor N6 turns ON by the HIGH signal applied to its gate, VDD is supplied to a current path which is then applied to the gate of the PMOS transistor P7 of the later stage. At this time, LOW is applied to the gate of the PMOS transistor P8. Since, therefore, the PMOS transistor P8 turns ON and the PMOS transistor P7 turns OFF, VDD which is the high withstand voltage Pch well potential VPW is applied to the gate to turn ON the NMOS transistor N7 and −9V which is the high withstand voltage Nch well potential VNW is output to the non-inverted value (XB) of the sub-decoder output. At this time, VDD is output as the inverted value /XB.

Then, the operation of the non-volatile semiconductor memory device having the above constitution will be described. FIG. 9 is a table showing the states of the respective terminals at the time of block selection when the whole chip selection signal CP is HIGH. In this table, the word line group selection signals are identified as B2, B4, B8, B16 and B32, and the more significant address signals are identified as A(5) to A(9). In the table, L, H, A and N mean 0V, VDD, active and non-active, respectively.

When LOW is input as the whole chip selection signal CP in the programming mode or the erasing mode, the block selection predecoder 11 does not operate even if the word line group selection signals B2 to B32 are input from the group selection signal output circuit 19. When the more significant address signal is input from the address signal output circuit 18 to the block selection predecoder 11 in this state, one of the more significant address decoding outputs XS(0) to XS(31) takes a selected state. When, further, the less significant address signal is input from the address signal output circuit 18 to the in-block selection predecoder 12, one of the less significant address decoding outputs XSPP(0) to XSPP(31) takes a selected state. At this time, only the word Line simultaneously selected by both of the more significant address decoding output XS and the less significant address decoding output XSPP takes a selected state.

When, on the other hand, HIGH is input as the whole chip selection signal CP and, for example, HIGH is input only to the word line group selection signal B2, the address signal A(5) becomes a non-active state and the other address signals A(6) to A(7) become an active state. Thereby, the OR gate to which the address signal A(5) is input always takes a selected state, and the two OR gates which are consecutive to the above OR gate are selected by the other address signals A(6) to A(9).

When, in place of above, HIGH is input as the whole chip selection signal CP and, for example, HIGH is input to the word line group selection signal B2 and B4, the address signals A(5) and A(6) take a non-active state and the other address signals A(7) to A(9) take an active state. Thereby, the OR gate to which the address signals A(5) and A(6) are input always take a selected state, and the four OR gates which are consecutive to the above OR gate are selected by the other address signals A(7) to A(9).

On the other hand, LOW is input as the whole chip selection signal CP to the block selection predecoder 11 in the reading mode. When the more significant address signal is input to the block selection predecoder 11 in this state, one of the more significant address decoding outputs XS(0) to XS(31) takes a selected state. When the less significant address signal is input to the in-block selection predecoder 12, one of the less significant address decoding outputs XSPP(0) to XSPP(31) takes a selected state, At this time, only the word line WL simultaneously selected by both of the more significant address decoding output XS and the less significant address decoding output XSPP takes a selected state.

Embodiment 2

Figure 10:
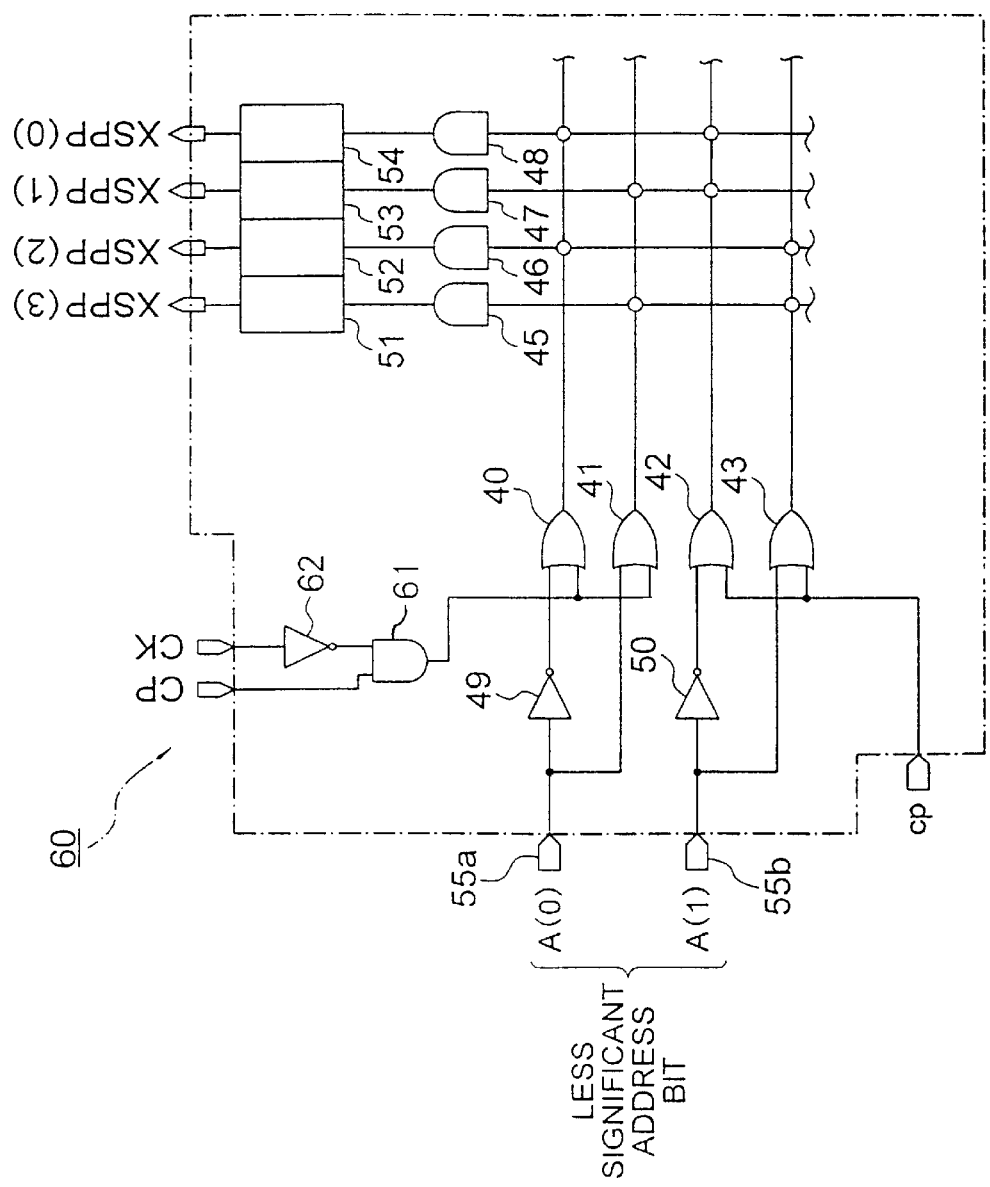
FIG. 10 is an equivalent circuit diagram showing a second Embodiment.

FIG. 10 is an equivalent circuit diagram showing a second Embodiment obtained by partly changing the structure of the in-block selection predecoder 12 shown in FIG. 4. An in-block selection predecoder 60 has, similar to the in-block selection predecoder 12, inverters 49,50, OR gates 40 to 43, AND gates 45 to 48 and decoding voltage changing circuits 51 to 54.

In the in-block selection predecoder 60, the OR gate 40 has an input to which a less significant address signal A(0) inverted by the inverter 49 is input, and the OR gate 41 has an input to which a non-inverted less significant address signal A(0) is input. The OR gate 42 has an input to which a less significant address signal A(1) inverted by the inverter 50 is input, and the OR gate 43 has an input to which a non-inverted less significant address signal A(1) is input. Each of the OR gates 40,41 has the other terminal to which a logic product obtained in the AND gate 61 between the whole chip selection signal CP and a checker mode signal CK inverted by the inverter 62. Each of the OR gates 42,43 has the other terminal to which the whole chip selection signal CP is input.

The operation of the in-block selection predecoder 60 of the present Embodiment will be described referring to a truth table of Table 4. Employment of the in-block selection predecoder 60 realizes an ordinary selection mode, a checker selection mode, and a flash selection mode. In the flash selection mode, odd word lines are collectively selected by the output of a selection signal ODD described later and even word lines are collectively selected by the output of a selection signal EVEN described later.

The truth table of Table 4 shows the states of the respective outputs in the ordinary selection mode when both of the whole chip selection signal CP and the checker mode signal OK are LOW or when the whole chip selection signal CP is LOW and the checker mode signal CK is HIGH.

When both of the less significant address signals A(0) and A(1) are LON, the respective outputs of the OR gates 40 to 43 are HIGH, LOW, HIGH and LOW in this turn, arid the less significant address decoding output XSPP(0) which is a selected output becomes HIGH and the others become LOW When the less significant address signal A(0) is HIGH and the less significant address signal A(1) is LOW, the respective outputs of the OR gates 40 to 43 are LOW, HIGH, HIGH and LOW in this turn, and the less significant address decoding output XSPP(1) becomes HIGH aind the others become LOW. When the less significant address signal A(0) is LOW and the less significant address signal A(1) is HIGH, the respective outputs of the OR gates 40 to 43 are HIGH, LOW, LOW and HIGH in this turn, and the Less significant address decoding output XSPP(2) becomes HIGH and the others become LOW. When both of the less significant address signals A(0) and A(1) are HIGH, the respective outputs of the OR gates 40 to 43 are LOW, HIGH, LOW and HIGH in this turn, and the less significant address decoding output XSPP(3) becomes HIGH and the others become LOW.

When LOW is input as the whole chip selection signal CP and LOW is input as the checker mode signal CK in the ordinary selection mode, or when LOW is input as the whole chip selection signal CP and HIGH is input as the checker mode signal CK, one of the less significant address decoding outputs XSPP(0) to XSPP(3) tales a selection state depending on the input states of the less significant address signals.

TABLE 4

| LESS SIGNIFICANT ADDRESS SIGNAL | | OUTPUT STATE OF OR | | | | SELECTED |
|---|---|---|---|---|---|---|
| A(1) | A(0) | 43 | 42 | 41 | 40 | OUTPUT |
| L | L | L | H | L | H | XSPP(0), |
| L | H | L | H | H | L | XSPP(1) |
| H | L | H | L | L | H | XSPP(2), |
| H | H | H | L | H | L | XSPP(3) |

The truth table of TABLE 5 shows the states of the respective outputs in the checker selection mode when both of the whole chip selection signal CP and the checker mode signal CK are HIGH.

When both of the less significant address signals A(0) and A(1) are LOW, the respective outputs of the OR gates 40 to 43 are HIGH. LOW, HIGH and HIGH in this turn, and all the selection signals ODD for the odd word lines WL are output as selected outputs. When the less significant address signals A(0) is HIGH and the less significant address signal A(1) is LOW, the respective outputs of the OR gates 40 to 43 are LOW, HIGH, HIGH and HIGH in this turn, and all the selection signals EVEN for the even word lines WL are output as the selected outputs. When the less significant address signals A(0) is LOW and the less significant address signal A(1) is HIGH, the respective outputs of the OR gates 40 to 43 are HIGH, LOW, HIGH and HIGH in this turn, and the selection signals ODD are output as selected outputs. When both of the less significant address signals A(0) and A(1) are HIGH, the respective outputs of the OR gates 40 to 43 are LOW, HIGH, HIGH and HIGH in this turn, and the selection signals EVEN are output as the selected outputs.

When HIGH is input as the whole chip selection signal CP and HIGH is input as the checker mode signal CK in the checker selection mode, all the OR gates to which the address signals of the non-active states are input take selected states. For example, when LOW is input as the less significant address signal A(0) in this state, the odd word lines WL are collectively selected, and when HIGH is input, the even word lines WL are collectively selected. When HIGH is input as the whole chip selection signal CP from the mode signal output circuit 23 to the block selection predecoder 11, the flash selection of the odd or even word lines WL in a plurality of the row decoding groups is

TABLE 5

| LESS SIGNIFICANT ADDRESS SIGNAL | | OUTPUT STATE OF OR | | | | SELECTED |
|---|---|---|---|---|---|---|
| A(1) | A(0) | 43 | 42 | 41 | 40 | OUTPUT |
| L | L | H | H | L | H | ODD |
| L | H | H | H | H | L | EVEN |
| H | L | H | H | L | H | ODD |
| H | H | H | H | H | L | EVEN |

A truth table of TABLE 6 shows the states of the respective outputs in the flash selection mode when the whole chip selection signal CP is HIGH and the checker mode signal CK is LOW.

When both of the less significant address signals A(0) and A(1) are LOW, the respective outputs of the OR gates 40 to 43 are all HIGH and the less significant address decoding outputs XSPP(0) to XSPP(3) which are selected outputs are HIGH. When the less significant address signal A(0) is HIGH and the less significant address signal A(1) is LOW, the respective outputs of the OR gates 40 to 43 are all HIGH and the less significant address decoding outputs XSPP(0) to XSPP(3) are HIGH. When the less significant address signal A(0) is LOW and the less significant address signal A(1) is HIGH, the respective outputs of the OR gates 40 to 43 are all HIGH and the less significant address decoding outputs XSPP(0) to XSPP(3) are HIGH. When both of the less significant address signals A(0) and A(1) are HIGH, the respective outputs of the OR gates 40 to 43 are all HIGH and the less significant address decoding outputs XSPP(0) to XSPP(3) are HIGH. In this manner, the less significant address decoding outputs are all HIGH. regardless of the addresses.

TABLE 6

| LESS SIGNIFICANT ADDRESS SIGNAL | | OUTPUT STATE OF OR | | | | SELECTED |
|---|---|---|---|---|---|---|
| A(1) | A(0) | 43 | 42 | 41 | 40 | OUTPUT |
| L | L | H | H | H | H | XSPP(0) |
| L | H | H | H | H | H | to |
| H | L | H | H | H | H | XSPP(3) |
| H | H | H | H | H | H | |

Embodiment 3

Figure 11:
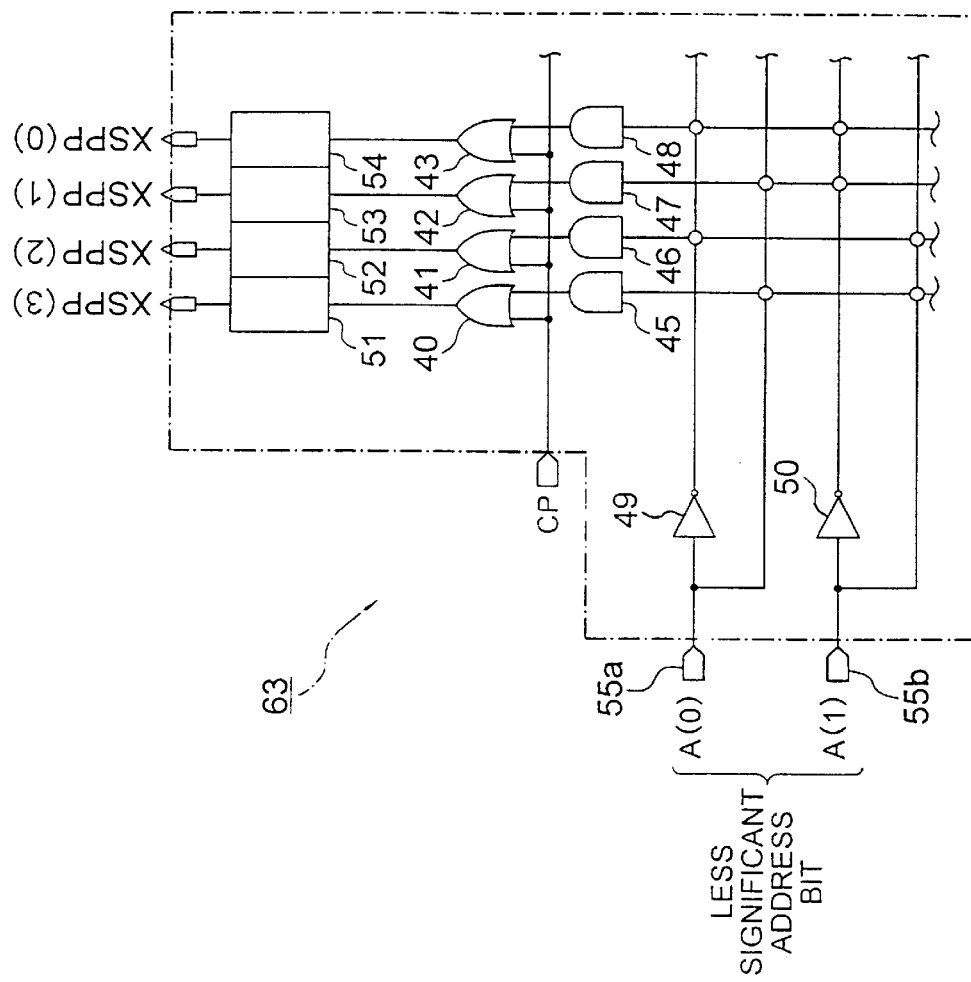
FIG. 11 is an equivalent circuit diagram showing a third Embodiment

FIG. 11 is an equivalent circuit diagram showing a third Embodiment obtained by partly changing the structure of the in-block selection predecoder 12 shown in FIG. 4. An in-block selection predecoder 63 having a word line flash selection function includes, similar to the in-block selection predecoder 12, inverters 49,50, OR gates 40 to 43, AND gates 45 to 48 and decoding voltage changing circuits 51 to 54.

In the in-block selection predecoder 63, the OR gates 40 to 43 are connected between the AND gates 45 to 48 and the decoding voltage changing circuits 51 to 54. In this constitution, the AND gate 45 supplies a logic product between the less significant address signals A(0) and A(1) to one terminal of the OR gate 40, and the AND gate 46 supplies a logic product between the less significant address signal A(0) after its inversion by the inverter 49 and the less significant address signal A(1) to one terminal of the OR gate 41. The AND gate 47 supplies a logic product between the less significant address signal A(0) and the less significant address signal A(1) after its inversion by the inverter 50 to one terminal of the OR gate 42, and the AND gate 48 supplies a logic product between the less significant address signal A(0) after its inversion by the inverter 49 and the less significant address signal A(1) after its inversion by the inverter 50 to one terminal of the OR gate 43. The whole chip selection signal CP is supplied to the other terminals of the respective OR gates 40 to 43.

The operation of the in-block selection predecoder 63 of the present Embodiment will be described referring to a truth table of Table 7 showing the states of the respective outputs when the whole chip selection signal CP is LOW. At first, the normal operation will be described.

When both of the less significant address signals A(0) and A(1) are LOW, the respective outputs of the inverters 49,50 become HIGH, and the AND gate 48 outputs HIGH, and the decoding voltage changing circuit 54 makes the less significant address decoding output XSPP(0) which is a selected output HIGH. At this time, the other less significant address decoding outputs XSPP become LOW. When the less significant address signal A(0) is HIGH and the less significant address signal A(1) is LOW, the output of the inverter 49 becomes LOW and the output of the inverter 50 becomes HIGH, the AND gate 47 outputs HIGH and the decoding voltage changing circuit 53 makes the less significant address decoding output XSPP(1) HIGH. At this time, the other less significant address decoding outputs XSPP become LOW.

When the less significant address signal A(0) is LOW and the less significant address signal A(1) is HIGH, the output of the inverter 49 becomes HIGH and the output of the inverter 50 becomes LOW, the AND gate 46 outputs HIGH and the decoding voltage changing circuit 52 makes the less significant address decoding output XSPP(2) HIGH. At this time, the other less significant address decoding outputs XSPP become LOW. At this time, the other less significant address decoding outputs XSPP become LOW. When both of the less significant address signals A(0) and A(1) are HIGH, the respective outputs of the inverters 49,50 become LOW, the AND gate 45 outputs HIGH and the decoding voltage changing circuit 51 makes the less significant address decoding output XSPP(3) HIGH. At this time, the other less significant address decoding outputs XSPP become LOW.

TABLE 7

| LESS SIGNIFICANT ADDRESS SIGNAL | | | |
|---|---|---|---|
| A(1) | A(0) | SELECTED AND GATE | SELECTED OUTPUT |
| L | L | 48 | XSPP(0) |
| L | H | 47 | XSPP(1) |
| H | L | 46 | XSPP(2) |
| H | H | 45 | XSPP(3) |

When the whole chip selection signal CP is HIGH, all the less significant address decoding outputs XSPP(0) to XSPP(3) become HIGH regardless of the states of the less significant address signals A(0) and A(1), and all the word lines can be collectively selected. As mentioned, in accordance with the in-block selection predecoder 63 of the present Embodiment, one of the less significant address decoding outputs XSPP takes a selected state depending on the input states of the less significant address signals when LOW is input as the whole chip selection signal CP. Although one of the less significant address decoding outputs XSPP takes a selected state before the outputs of the AND gates depending on the input states of the less significant address signals when HIGH is input as the whole chip selection signal CP, all the outputs of the respective OR gates are compulsorily made to be HIGH and all the less significant address decoding outputs XSPP take selected states because the whole chip selection signal CP is input to the OR gates present after the outputs of the AND gates Since, in the non-volatile semiconductor memory device of the above Embodiments. the block selection predecoder 11 is present in the address decoder, the circuit can be formed by the logic elements operating at the power supply voltage, and the chip areas can be reduced by employing transistors having a low source-drain withstand voltage and a short channel length. The retention of the block in which the flash programming and erasing are conducted in advance is unnecessary, and the selection of a block to be processed can be achieved only by changing the address. Therefore, the time required for the flash programming and the flash erasing of a plurality of the blocks can be reduced without a further element such as an external input element. The establishment of the number of the blocks subject to the flash programming and the flash erasing may be made only once at the time of establishing the modes, and an unnecessary program sequence can be deleted to reduce the time.

As mentioned, since the voltages applied to the memory cells are similar to those conventionally employed, conventional memory cells may be employed without modification.

Since the above embodiments are described only for examples, the present invention is not limited to the above embodiments and various modifications or alternations can be easily made therefrom by those skilled in the art without departing from the scope of the present invention.

What is claimed is:

1. A non-volatile semiconductor memory device comprising:

a plurality of non-volatile memory cells arranged in a matrix, a plurality of word lines each disposed for a corresponding row of said memory cells, a plurality of bit lines each disposed for a corresponding column of said memory cells, a row decoder including a plurality of row decoding groups each for controlling a specified number of said plurality of word lines;

a column decoder for selecting one of said bit lines, a mode signal output section for outputting a mode signal for performing flash programming or flash erasing, a group selection signal output section for outputting, in timing with the output of said mode signal, a group selection signal for selecting one of said row decoding groups, a first selection section for selecting one of said row decoding groups based on said group selection signal, a second selection section for selecting one of said specified number of said word lines corresponding to said selected one of said row decoding groups, and a flash erasing or programming section for effecting flash erasing or flash programming of said memory cells corresponding to said selected one of said specified number of said word lines, wherein said device further comprising an address output means outputting a more significant address signal and a less significant address signal to said first and said second selection sections in specified timings.

2. The non-volatile semiconductor memory device as defined in claim 1, wherein said first selection section has a masking means for masking a less significant bit of a more significant address decoding output which is output to said row decoding group designated by said more significant address signal in accordance with said group selection signal.

3. The non-volatile semiconductor memory device as defined in claim 2, wherein said first selection section has a plurality of first AND gates outputting a logic product between said mode signal and said group selection signal, a plurality of OR gates having one input connected to an inverted or non-inverted output of said more significant address signal and the other input connected to said output of said plurality of first AND gates, and a plurality of second AND gates outputting as the more significant address decoding output of logic product of the corresponding outputs selected among said plurality of OR gates.

4. The non-volatile semiconductor memory device as defined in claim 1, wherein said second selection section has a masking means for masking a less significant address decoding output which is output to said row decoding group designated by said less significant address signal in accordance with said mode signal.

5. The non-volatile semiconductor memory device as defined in claim 4, wherein said masking means has a means of changing from a first state of masking all the less significant address decoding outputs to a second state of masking a specified output and vice versa.

6. The non-volatile semiconductor memory device as defined in claim 4, wherein said second selection section has a plurality of OR gates having one input connected to an inverted or non-inverted output of said less significant address signal and the other input connected to receive said mode signal, a plurality of AND gates outputting a logic product of the corresponding outputs selected among said plurality of said OR gates, and decoding voltage changing circuits outputting said less significant address decoding outputs while changing decoding voltages in accordance with the output of said plurality of AND gates.

7. The non-volatile semiconductor memory device as defined in claim 4, wherein said second selection section has a first AND gate outputting a logic product between an inverted signal of an input checker mode signal and said mode signal, a plurality of OR gates having one input connected to an inverted or non-inverted output of said less significant address signal and the other input connected to the, output of said AND gate, a plurality of second AND gates outputting a logic product of the corresponding outputs selected among the outputs of said OR gates, and decoding voltage changing circuits outputting said less significant address decoding outputs while changing decoding voltages in accordance with the respective outputs of said plurality second AND gates.

8. The non-volatile semiconductor memory device as defined in claim 4, wherein said second selection section has a plurality of AND gates outputting a logic product between the corresponding outputs selected from inverted outputs and non-inverted outputs of said less significant address signals, a plurality of OR gates having one input connected to an output of said plurality of the AND gates and the other input to which said mode signal is input, and decoding voltage changing circuits outputting said less significant address decoding outputs while changing decoding voltages in accordance with the respective outputs of said plurality of OR gates.

* * * * *